United States Patent
Tanaka et al.

(10) Patent No.: US 10,295,769 B2
(45) Date of Patent: May 21, 2019

(54) OPTO-ELECTRIC HYBRID BOARD AND METHOD OF MANUFACTURING SAME

(71) Applicant: NITTO DENKO CORPORATION, Ibaraki-shi, Osaka (JP)

(72) Inventors: Naoyuki Tanaka, Ibaraki (JP); Yuichi Tsujita, Ibaraki (JP)

(73) Assignee: NITTO DENKO CORPORATION, Ibaraki-shi (JP)

( * ) Notice: Subject to any disclaimer, the term of this patent is extended or adjusted under 35 U.S.C. 154(b) by 0 days.

(21) Appl. No.: 15/527,502

(22) PCT Filed: Nov. 25, 2015

(86) PCT No.: PCT/JP2015/082965
§ 371 (c)(1),
(2) Date: May 17, 2017

(87) PCT Pub. No.: WO2016/084815
PCT Pub. Date: Jun. 2, 2016

(65) Prior Publication Data
US 2017/0329093 A1      Nov. 16, 2017

(30) Foreign Application Priority Data

Nov. 25, 2014 (JP) .................................. 2014-237820
Nov. 11, 2015 (JP) .................................. 2015-221084

(51) Int. Cl.
*G02B 6/42*      (2006.01)
*G02B 6/122*      (2006.01)
(Continued)

(52) U.S. Cl.
CPC .......... *G02B 6/4281* (2013.01); *G02B 6/122* (2013.01); *G02B 6/43* (2013.01); *H05K 1/0274* (2013.01);
(Continued)

(58) Field of Classification Search
CPC ........ G02B 6/4281; G02B 6/43; G02B 6/122; G02B 6/138; G02B 6/136; G02B 6/4214;
(Continued)

(56) References Cited

U.S. PATENT DOCUMENTS 8,142,672 B2   3/2012  Hodono
9,046,646 B2   6/2015  Tsujita et al.
(Continued)

FOREIGN PATENT DOCUMENTS

JP    2001-154044 A    6/2001
JP    2002-231872 A    8/2002
(Continued)

OTHER PUBLICATIONS

International Search Report dated Jan. 19, 2016, issued in counterpart application No. PCT/JP2015/082965. (2 pages).
(Continued)

*Primary Examiner* — John Bedtelyon
(74) *Attorney, Agent, or Firm* — Westerman, Hattori, Daniels & Adrian, LLP

(57) ABSTRACT

An opto-electric hybrid board includes: an electric circuit board including an insulation layer and electrical interconnect lines formed on the front surface of the insulation layer; and an optical waveguide provided on the back surface side of the insulation layer of the electric circuit board, with a metal layer therebetween. At least one opening is formed by removing at least part of a region of the metal layer which is overlaid on the contour of an end portion of the optical waveguide. The optical waveguide is formed, with part of the optical waveguide extending into the opening. The opto-electric hybrid board is favorably usable over a prolonged period because the end portion of the optical waveguide provided on the back surface side of the electric circuit board does not peel off the metal layer.

16 Claims, 12 Drawing Sheets

(51) Int. Cl.
*G02B 6/43* (2006.01)
*G02B 6/136* (2006.01)
*G02B 6/138* (2006.01)
*H05K 1/02* (2006.01)
*H05K 3/06* (2006.01)

(52) U.S. Cl.
CPC ............... *H05K 3/06* (2013.01); *G02B 6/136* (2013.01); *G02B 6/138* (2013.01); *G02B 6/4214* (2013.01); *H05K 1/0278* (2013.01); *H05K 2201/09036* (2013.01)

(58) Field of Classification Search
CPC ...... H05K 1/0274; H05K 3/06; H05K 1/0278; H05K 2201/09036
See application file for complete search history.

(56) References Cited

U.S. PATENT DOCUMENTS

| | | | |
|---|---|---|---|
| 9,129,949 | B2 | 9/2015 | Asada et al. |
| 9,274,273 | B2 | 3/2016 | Masuda et al. |
| 2009/0269704 | A1 | 10/2009 | Hodono |
| 2013/0221516 | A1 | 8/2013 | Asada et al. |
| 2013/0243371 | A1 | 9/2013 | Tsujita et al. |
| 2014/0126857 | A1 | 5/2014 | Masuda et al. |
| 2014/0147076 | A1 | 5/2014 | Tsujita et al. |

FOREIGN PATENT DOCUMENTS

| | | |
|---|---|---|
| JP | 2009-265342 A | 11/2009 |
| JP | 2010-266598 A | 11/2010 |
| JP | 2011-114133 A | 6/2011 |
| JP | 2011-134853 A | 7/2011 |
| JP | 2013-15736 A | 1/2013 |
| JP | 2013-195532 A | 9/2013 |
| JP | 2014-95782 A | 5/2014 |
| JP | 2014-106355 A | 6/2014 |
| WO | 2012/108011 A1 | 8/2012 |

OTHER PUBLICATIONS

Notification of Transmittal of Translation of the International Preliminary Report on Patentability (Form PCT/IB/338) issued in counterpart International Application No. PCT/JP2015/082965 dated Jun. 8, 2017, with Forms PCT/IB/373 and PCT/ISA/237. (14 pages).

FIG. 1A
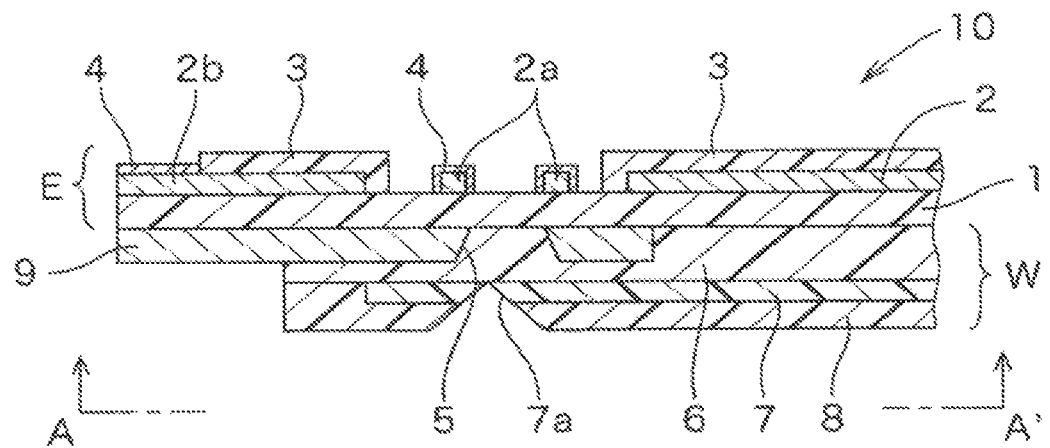
FIG. 1B
FIG. 1C
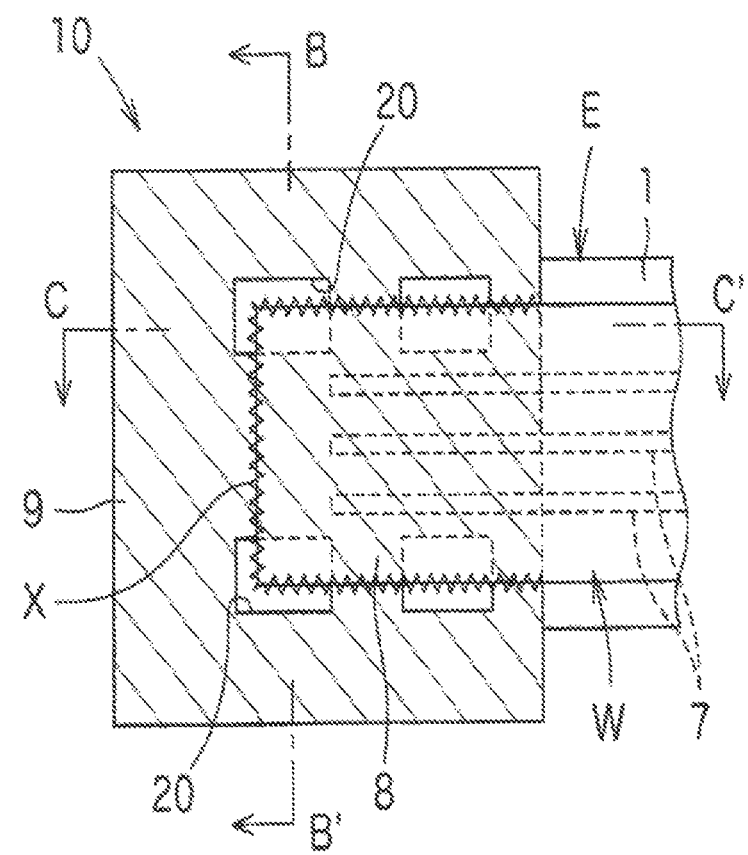
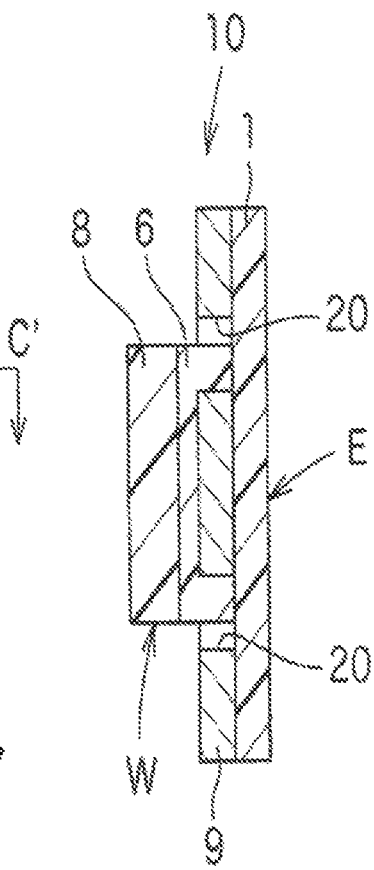

Related Art ns,769 B2

OPTO-ELECTRIC HYBRID BOARD AND METHOD OF MANUFACTURING SAME

TECHNICAL FIELD

The present invention relates to an opto-electric hybrid board including an electric circuit board and an optical waveguide which are stacked together, and a method of manufacturing the same.

BACKGROUND ART

With the increase in the amount of transmission information, optical interconnect lines in addition to electrical interconnect lines have been used in recent electronic devices and the like. A large number of opto-electric hybrid boards capable of transmitting electrical signals and optical signals at the same time have been used. As shown in FIG. 13, a known example of such opto-electric hybrid boards has a structure in which an electric circuit board E includes an insulation layer 1 made of polyimide and the like and serving as a substrate, and electrical interconnect lines 2 having an electrically conductive pattern and provided on the front surface of the insulation layer 1, and in which an optical waveguide W is provided on the back surface side of the insulation layer 1, with a metal layer 9 for reinforcement provided therebetween (see PTL 1, for example). The front surface of the electric circuit board E is insulated and protected by a coverlay 3. The metal layer 9 is provided with through holes 5 and 5' for optical coupling between the optical waveguide W and an optical element (not shown) to be mounted on the front surface side of the electric circuit board E. The optical waveguide W includes three layers: an under cladding layer 6; a core 7 serving as an optical path; and an over cladding layer 8.

There is a difference in coefficient of linear expansion between the insulation layer 1 and the optical waveguide W provided on the back surface side thereof. If the insulation layer 1 and the optical waveguide W are directly stacked together, the difference in coefficient of linear expansion therebetween causes stresses and slight bending in the optical waveguide W due to ambient temperature, resulting in increased light propagation losses. The metal layer 9 is provided to avoid such increased light propagation losses. In accordance with trends toward a decrease in the size of electronic devices and an increase in the degree of integration thereof, the opto-electric hybrid boards have been often required to have flexibility in recent years for use in small spaces and in movable sections such as hinges. For the increase in flexibility of an opto-electric hybrid board in which the metal layer 9 is interposed as described above for the provision of the optical waveguide W, it has been proposed to partially remove the metal layer 9 itself to cause the cladding layers of the optical waveguide W to enter the sites where the metal layer 9 is removed, thereby increasing the flexibility (see PTL 2, for example).

RELATED ART DOCUMENT

Patent Document

PTL 1: JP-A-2009-265342
PTL 2: JP-A-2013-195532

SUMMARY OF INVENTION

For a further increase in flexibility thereof, opto-electric hybrid boards in which the electric circuit board E has an increased width only in its opposite end portions serving as optical coupling portions or portions for connection to connectors and reinforced with metal layers 9 and 9' while having a decreased width in its intermediate portion have been often used in recent years, as shown in FIG. 14A which is a view of such an opto-electric hybrid board as seen from the optical waveguide W side.

Unfortunately, such an opto-electric hybrid board having a high degree of flexibility is often greatly pulled or twisted. This generates different stresses between the metal layers 9 and 9' and the optical waveguide W which are made of different materials. It has turned out that the difference in stresses is concentrated in corner portions P (portions enclosed within small circles in FIG. 14A) on opposite ends of the optical waveguide W to appear in the form of distortions or warpage, thereby resulting in a problem such that peeling off in these portions is prone to occur.

As shown in FIG. 14B, an opto-electric hybrid board of the type having no metal layers 9 and 9' is configured such that the opposite ends of the optical waveguide W are directly disposed on the back surface of the insulation layer 1 made of polyimide and the like. In such a case, the optical waveguide W and the insulation layer 1 are also made of different materials although the two types of resins are joined together. It has hence turned out that the optical waveguide W tends to peel off in the corner portions P thereof due to the difference in stresses.

In view of the foregoing, it is therefore an object of the present invention to provide an opto-electric hybrid board favorably usable over a prolonged period while preventing end portions of an optical waveguide disposed in overlaid relation with a metal layer or an insulation layer on the back surface side of an electric circuit board from peeling off the metal layer or the insulation layer, and a method of manufacturing the same.

To accomplish the aforementioned object, a first aspect of the present invention is intended for an opto-electric hybrid board comprising: an electric circuit board including an insulation layer having front and back surfaces, and an electrical interconnect line formed on the front surface of the insulation layer; and an optical waveguide provided on the back surface side of the insulation layer of the electric circuit board, with a metal layer therebetween, the metal layer is overlaid on at least one end portion of the optical waveguide in such a configuration that the contour of the end portion of the optical waveguide is disposed inside the contour of the metal layer, wherein at least one opening is formed in at least part of a region of the metal layer which is overlaid on the contour of the end portion of the optical waveguide, and wherein part of the optical waveguide extends into the at least one opening. In particular, a second aspect of the present invention is intended for the opto-electric hybrid board wherein the at least one opening in the metal layer includes a plurality of openings, and the openings are formed discontinuously along the contour of the end portion of the optical waveguide.

A third aspect of the present invention is intended for an opto-electric hybrid board comprising: an electric circuit board including an insulation layer having front and back surfaces, and an electrical interconnect line formed on the front surface of the insulation layer; and an optical waveguide provided on the back surface side of the insulation layer of the electric circuit board, with a metal layer therebetween, wherein the metal layer is overlaid on at least one end portion of the optical waveguide in such a configuration that the contour of the end portion of the optical waveguide coincides with the contour of the metal layer or is disposed outside the contour of the metal layer, wherein at least one opening is formed in at least part of a region of the metal layer in which the contour of the metal layer is overlaid on the end portion of the optical waveguide, and wherein part of the optical waveguide extends into the at least one opening. In particular, a fourth aspect of the present invention is intended for the opto-electric hybrid board wherein the at least one opening in the metal layer includes a plurality of openings, and the openings are formed discontinuously along the contour of the metal layer itself.

A fifth aspect of the present invention is intended for an opto-electric hybrid board comprising: an electric circuit board including an insulation layer having front and back surfaces, and an electrical interconnect line formed on the front surface of the insulation layer; and an optical waveguide provided directly on the back surface side of the insulation layer of the electric circuit board, wherein the insulation layer is overlaid on at least one end portion of the optical waveguide in such a configuration that the contour of the end portion of the optical waveguide is disposed inside the contour of the insulation layer, wherein at least one recess is formed in at least part of a region of the insulation layer which is overlaid on the contour of the end portion of the optical waveguide, and wherein part of the optical waveguide extends into the at least one recess. In particular, a sixth aspect of the present invention is intended for the opto-electric hybrid board wherein the at least one recess in the insulation layer includes a plurality of recesses, and the recesses are formed discontinuously along the contour of the end portion of the optical waveguide.

A seventh aspect of the present invention is intended for an opto-electric hybrid board comprising: an electric circuit board including an insulation layer having front and back surfaces, and an electrical interconnect line formed on the front surface of the insulation layer; and an optical waveguide provided directly on the back surface side of the insulation layer of the electric circuit board, wherein the insulation layer is overlaid on at least one end portion of the optical waveguide in such a configuration that the contour of the end portion of the optical waveguide coincides with the contour of the insulation layer or is disposed outside the contour of the insulation layer, wherein at least one recess is formed in at least part of a region of the insulation layer in which the contour of the insulation layer is overlaid on the end portion of the optical waveguide, and wherein part of the optical waveguide extends into the at least one recess. In particular, an eighth aspect of the present invention is intended for the opto-electric hybrid board wherein the at least one recess in the insulation layer includes a plurality of recesses, and the recesses are formed discontinuously along the contour of the insulation layer itself.

A ninth aspect of the present invention is intended for a method of manufacturing an opto-electric hybrid board. The method comprises the steps of: preparing an electric circuit board including an insulation layer having front and back surfaces and an electrical interconnect line formed on the front surface of the insulation layer, a metal layer being formed on the back surface of the insulation layer; and forming an optical waveguide on the metal layer so that the contour of at least one end portion of the optical waveguide is disposed inside the contour of the metal layer, wherein the preparing the electric circuit board includes forming at least one opening by removing at least part of a region of the metal layer which is to be overlaid on the contour of the end portion of the optical waveguide, and wherein the forming the optical waveguide includes forming the optical waveguide such that part of the optical waveguide extends into the at least one opening in the metal layer. In particular, a tenth aspect of the present invention is intended for the method of manufacturing an opto-electric hybrid board, wherein the at least one opening in the metal layer includes a plurality of openings, and the step of preparing the electric circuit board includes forming the openings discontinuously along the contour of the end portion of the optical waveguide.

An eleventh aspect of the present invention is intended for a method of manufacturing an opto-electric hybrid board. The method comprises the steps of: preparing an electric circuit board including an insulation layer having front and back surfaces and an electrical interconnect line formed on the front surface of the insulation layer, a metal layer being formed on the back surface of the insulation layer; and forming an optical waveguide on the metal layer so that the contour of at least one end portion of the optical waveguide coincides with the contour of the metal layer or is disposed outside the contour of the metal layer, wherein the preparing the electric circuit board includes forming at least one opening by removing at least part of a region of the metal layer in which the contour of the metal layer is to be overlaid on the end portion of the optical waveguide, and wherein forming the optical waveguide includes forming the optical waveguide such that part of the optical waveguide extending into the at least one opening in the metal layer. In particular, a twelfth aspect of the present invention is intended for the method of manufacturing an opto-electric hybrid board, wherein the at least one opening in the metal layer includes a plurality of openings, and the step of preparing the electric circuit board includes forming the openings discontinuously along the contour of the metal layer itself.

A thirteenth aspect of the present invention is intended for a method of manufacturing an opto-electric hybrid board. The method comprises the steps of: preparing an electric circuit board including an insulation layer having front and back surfaces and an electrical interconnect line formed on the front surface of the insulation layer; and forming an optical waveguide on the insulation layer so that the contour of at least one end portion of the optical waveguide is disposed inside the contour of the insulation layer, wherein the preparing the electric circuit board includes forming at least one recess in at least part of a region of the insulation layer which is to be overlaid on the contour of the end portion of the optical waveguide, and wherein the forming the optical waveguide includes forming the optical waveguide such that part of the optical waveguide extends into the at least one recess in the insulation layer. In particular, a fourteenth aspect of the present invention is intended for the method of manufacturing an opto-electric hybrid board, wherein the at least one recess in the insulation layer includes a plurality of recesses, and the recesses are formed discontinuously along the contour of the end portion of the optical waveguide.

A fifteenth aspect of the present invention is intended for a method of manufacturing an opto-electric hybrid board. The method comprises the steps of: preparing an electric circuit board including an insulation layer having front and back surfaces and an electrical interconnect line formed on the front surface of the insulation layer; and forming an optical waveguide on the insulation layer so that the contour of at least one end portion of the optical waveguide coincides with the contour of the insulation layer or is disposed outside the contour of the insulation layer, wherein the preparing the electric circuit board includes forming at least one recess in at least part of a region of the insulation layer in which the contour of the insulation layer is to be overlaid on the end portion of the optical waveguide, and wherein the forming the optical waveguide includes forming the optical waveguide such that part of the optical waveguide extends into the recess in the insulation layer. In particular, a sixteenth aspect of the present invention is intended for the method of manufacturing an opto-electric hybrid board, wherein the at least one recess in the insulation layer includes a plurality of recesses, and the recesses are formed discontinuously along the contour of the insulation layer itself.

In the opto-electric hybrid board according to the present invention, the recess (or the opening for the metal layer by removing the metal layer) is formed by partially removing the region in which the metal layer or the insulation layer overlaid on the end portion of the optical waveguide is overlaid on the contour of the end portion of the optical waveguide or the region in which the contour of the metal layer or the insulation layer is overlaid on the end portion of the optical waveguide on the back surface side of the electric circuit board, and part of the optical waveguide extends into the recess.

In this configuration, part of the optical waveguide extends into either the opening provided in the metal layer or the recess provided in the insulation layer on the contour of the end portion of the optical waveguide overlaid on the back surface of the metal layer or the insulation layer and is less prone to peel off because of the concentration of stresses. Thus, the part of the optical waveguide extending into either the opening or the recess produces what is called an anchoring effect to make the optical waveguide less prone to peel off, as compared with a configuration in which flat surfaces are joined to each other.

In particular, the metal layer and the optical waveguide have a low peel strength at the laminated interface thereof. Thus, part of the optical waveguide extending into the opening provided in the metal layer is directly joined to the insulation layer to dramatically increase the peel strength therebetween. For this reason, if either the metal layer and the optical waveguide or the insulation layer and the optical waveguide differ from each other in internal stresses generated by external loads or heat in the laminate portion thereof, warpage and distortions based on the difference in stresses do not exert influences on the end portion of the optical waveguide.

Thus, the optical waveguide does not peel off in its end portions in the manufacturing steps including mounting an optical element and the like, in the step of incorporating the opto-electric hybrid board into an electronic device and the like and during the actual use thereof. This allows the opto-electric hybrid board to be used favorably over a prolonged period.

In particular, when the openings provided in the metal layer or the recesses provided in the insulation layer are formed discontinuously along the contour of the end portion of the optical waveguide or along the contour of the metal layer or the insulation layer itself, the present invention is excellent in the effect of preventing the optical waveguide from peeling off, which in turn is preferable.

The method of manufacturing an opto-electric hybrid board according to the present invention is capable of efficiently providing the opto-electric hybrid board of the present invention.

BRIEF DESCRIPTION OF DRAWINGS

FIG. 1A is a schematic partial vertical sectional view of one embodiment of an opto-electric hybrid board in the present invention; FIG. 1B is a view as seen in the direction of the arrows A-A' of FIG. 1A; and FIG. 1C is a sectional view taken along the line B-B' of FIG. 1B.

DESCRIPTION OF EMBODIMENTS

Next, embodiments according to the present invention will now be described in detail with reference to the drawings. It should be noted that the present invention is not limited to the embodiments.

Figure 2:
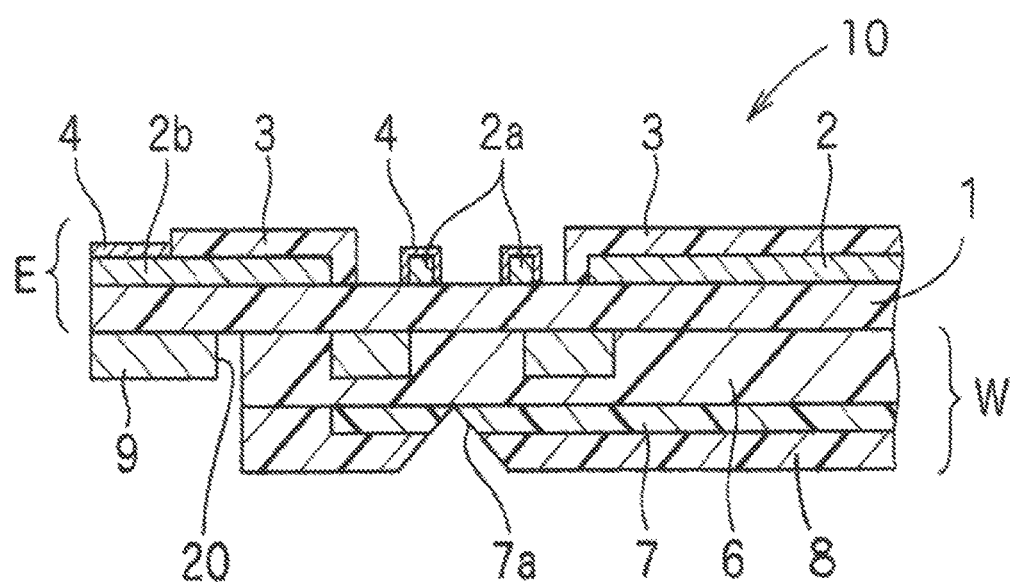
FIG. 2 is a sectional view taken along the line C-C' of FIG. 1B.

FIG. 1A is a schematic partial vertical sectional view of an opto-electric hybrid board according to one embodiment of the present invention. FIG. 1B is a view as seen in the direction of the arrows A-A' of FIG. 1A. FIG. 1C is a sectional view taken along the line B-B' of FIG. 1B. FIG. 2 is a sectional view taken along the line C-C' of FIG. 1B. This opto-electric hybrid board 10 includes: an electric circuit board E including an insulation layer 1 and electrical interconnect lines 2 provided on the front surface of the insulation layer 1; and an optical waveguide W provided on the back surface side of the insulation layer 1.

In the electric circuit board E, the electrical interconnect lines 2 including optical element mounting pads 2a, a connector mounting pad 2b, other pads for mounting variable elements, grounding electrodes and the like (not shown) are formed on the front surface of the insulation layer 1 made of polyimide and the like. The electrical interconnect lines 2 except the pads 2a and the like are insulated and protected by a coverlay 3 made of polyimide and the like. The front surface of the pads 2a and the like not protected by the coverlay 3 is covered with an electroplated layer 4 made of gold, nickel and the like.

The optical waveguide W provided on the back surface side of the insulation layer 1 has a substantially rectangular shape elongated in a horizontal direction as seen in plan view, and includes an under cladding layer 6, a core 7 formed in a predetermined pattern on the front surface (the lower surface as seen in FIG. 1A) of the under cladding layer 6, and an over cladding layer 8 integral with the front surface of the under cladding layer 6 while covering the core 7.

A portion of the core 7 corresponding to the optical element mounting pads 2a of the electric circuit board E is in the form of an inclined surface at 45 degrees with respect to the direction in which the core 7 extends. The inclined surface serves as a light reflecting surface 7a. The light reflecting surface 7a functions to change the direction of light propagated in the core 7 by 90 degrees to cause the light to enter a light-receiving portion of an optical element or to change the direction of light exiting from a light-emitting portion of an optical element by 90 degrees to cause the light to enter the core 7.

Figure 14A:
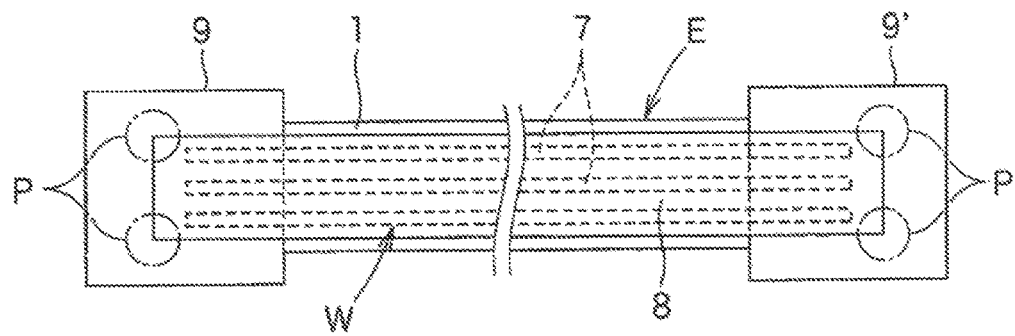
FIGS. 14A and 14B are illustrations for illustrating problems of a conventional opto-electric hybrid board.
Figure 14B:
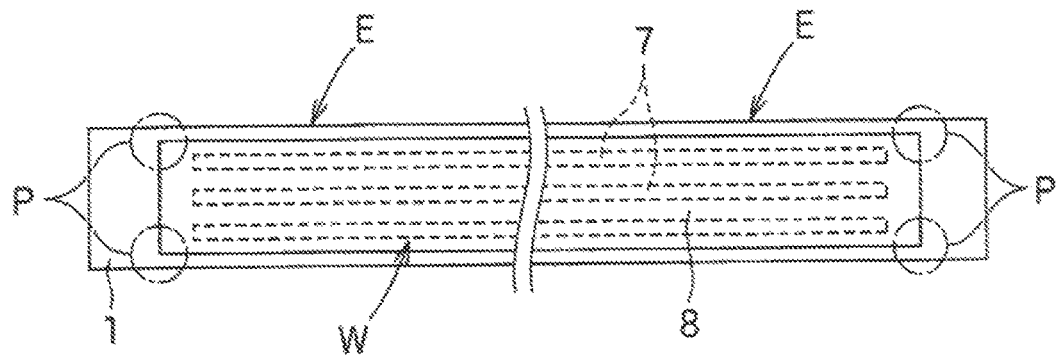

A metal layer 9 for reinforcing the opto-electric hybrid board 10 is provided between the electric circuit board E and the optical waveguide W. The metal layer 9 is formed in opposite end portions (with reference to FIG. 14A) other than an intermediate portion where flexibility is required, and is patterned in such a configuration as to partially overlap opposite end portions of the optical waveguide W. The metal layer 9 is provided with a through hole 5 for ensuring an optical path between the core 7 of the optical waveguide W and the optical element. The under cladding layer 6 extends into the through hole 5.

As shown in FIG. 1B, the metal layer 9 includes a total of four openings 20 of a rectangular plan configuration which are formed by partially removing two locations in each opposite side portion extending along the length of the optical waveguide W in a region of the metal layer 9 which is overlaid on the contour of the optical waveguide W. As shown in FIGS. 1C and 2, the under cladding layer 6 extends into the openings 20, so that the insulation layer 1 is directly firmly joined to the under cladding layer 6 extending into the openings 20. This is a striking feature of the present invention. In FIG. 1B, the through hole 5 is not shown, and an area where the metal layer 9 is formed is shaded by means of widely spaced diagonal lines extending from top left to bottom right (the same applies to the subsequent figures).

With reference to FIGS. 1A, 1B and 2, the right-hand portion of the opto-electric hybrid board 10 is identical in structure with the left-hand portion thereof shown in the figure except that the right-hand portion is a mirror image of the left-hand portion, and hence will not be described and shown.

Next, a method of manufacturing the opto-electric hybrid board 10 will be described (with reference to FIGS. 3A to 3D and FIGS. 4A to 4D).

First, the metal layer 9 of a planar configuration is prepared. A photosensitive insulating resin including polyimide and the like is applied to the front surface of the metal layer 9 to form the insulation layer 1 having a predetermined pattern by a photolithographic process (with reference to FIG. 3A). The insulation layer 1 has a thickness in the range of 3 to 50 μm, for example. Examples of a material for the formation of the metal layer 9 include stainless steel, copper, silver, aluminum, nickel, chromium, titanium, platinum and gold. In particular, stainless steel is preferable from the viewpoint of rigidity and the like. Although depending on the material of the metal layer 9, the thickness of the metal layer 9 is in the range of 10 to 70 μm, for example, when stainless steel is used. When the thickness of the metal layer 9 is less than 10 μm, there is apprehension that a sufficient reinforcing effect is not provided. When the thickness of the metal layer 9 is greater than 70 μm, there is apprehension that an increase in the distance that light travels in the through hole 5 of the metal layer 9 results in an increase in optical losses.

Figure 3A:
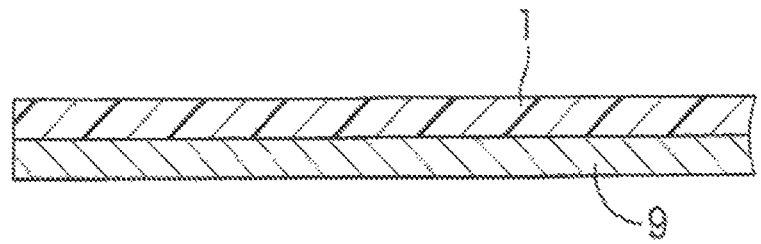
FIGS. 3A to 3D are illustrations showing the steps of producing an electric circuit board in a method of manufacturing the opto-electric hybrid board.
Figure 3B:
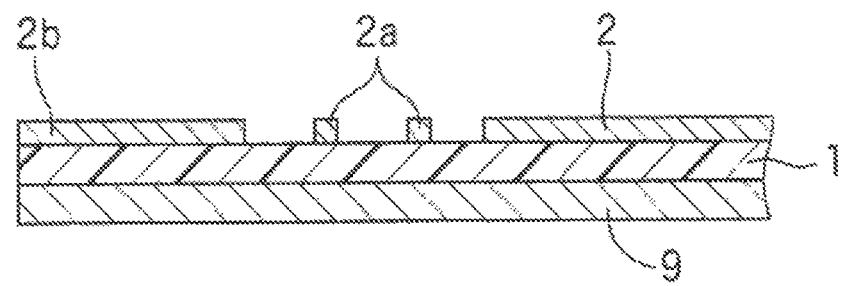

Next, as shown in FIG. 3B, the electrical interconnect lines 2 (including the optical element mounting pads 2a, the connector mounting pad 2b, other pads, grounding electrodes and the like; the same shall apply hereinafter) are formed on the front surface of the insulation layer 1 by a semi-additive process, for example. This process is as follows. First, a metal film (not shown) made of copper, chromium and the like is formed on the front surface of the insulation layer 1 by sputtering, electroless plating or the like. This metal layer serves as a seed layer (a layer serving as a basis material for the formation of an electroplated layer) for a subsequent electroplating process. Then, a photosensitive resist (not shown) is laminated to the opposite surfaces of a laminate comprised of the metal layer 9, the insulation layer 1 and the seed layer. Thereafter, a photolithographic process is performed to form holes having the pattern of the electrical interconnect lines 2 in the photosensitive resist on the side where the seed layer is formed, so that surface portions of the seed layer are uncovered at the bottoms of the holes. Next, electroplating is performed to form an electroplated layer made of copper and the like in a stacked manner on the surface portions of the seed layer uncovered at the bottoms of the holes. Then, the photosensitive resist is stripped away using an aqueous sodium hydroxide solution and the like. Thereafter, a portion of the seed layer on which the electroplated layer is not formed is removed by soft etching. Laminate portions comprised of the remaining seed layer and the electroplated layer become the electrical interconnect lines 2.

Figure 3C:
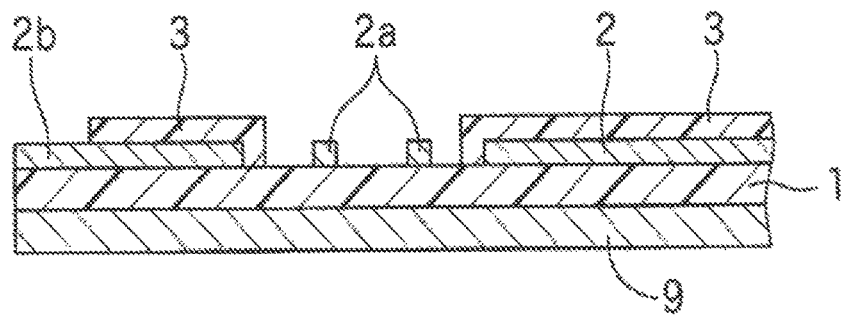

Next, as shown in FIG. 3C, a photosensitive insulating resin including polyimide and the like is applied to portions of the electrical interconnect lines 2 other than the optical element mounting pads 2a, part of the connector mounting pad 2b and the like to form the coverlay 3 by a photolithographic process.

Figure 3D:
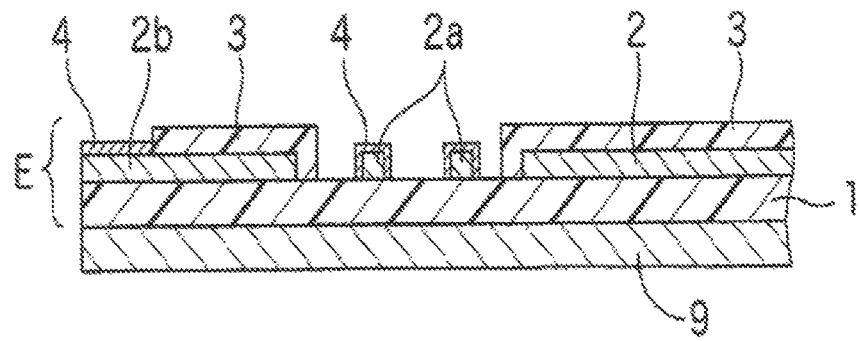

Then, as shown in FIG. 3D, the electroplated layer 4 is formed on the front surfaces of the optical element mounting pads 2a, the part of the connector mounting pad 2b and the like which are not covered with the coverlay 3. In this manner, the electric circuit board E is formed.

Next, a photosensitive resist is laminated to the opposite surfaces of a laminate comprised of the metal layer 9 and the electric circuit board E. Thereafter, holes are formed by a photolithographic process in portions of the photosensitive resist on the back surface side (the surface opposite from the electric circuit board E) of the metal layer 9 which correspond to a portion not requiring the metal layer 9, a portion (with reference to FIG. 1A) where the through hole 5 for the optical path is to be formed, and portions (with reference to FIG. 2) where the openings 20 are to be formed, so that the back surface of the metal layer 9 is partially uncovered.

Figure 4A:
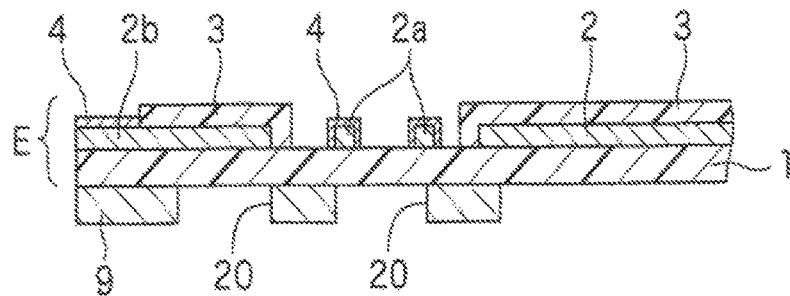
FIGS. 4A to 4D are illustrations showing the steps of producing an optical waveguide in the method of manufacturing the opto-electric hybrid board.

Then, the uncovered portions of the metal layer 9 are removed by etching using an aqueous etching solution for the metal material of the metal layer 9 (for example, an aqueous ferric chloride solution is used as the aqueous etching solution when the metal layer 9 is a stainless steel layer), so that the insulation layer 1 is uncovered in the sites where the metal layer 9 is removed. Thereafter, the photosensitive resist is stripped away using an aqueous sodium hydroxide solution and the like. Thus, as shown in FIG. 4A, the metal layer 9 is formed only in a region where the reinforcement is required, and the through hole 5 (with reference to FIG. 1A) for the optical path and the openings 20 for entry of part of the optical waveguide W thereinto are formed at the same time.

Figure 4B:
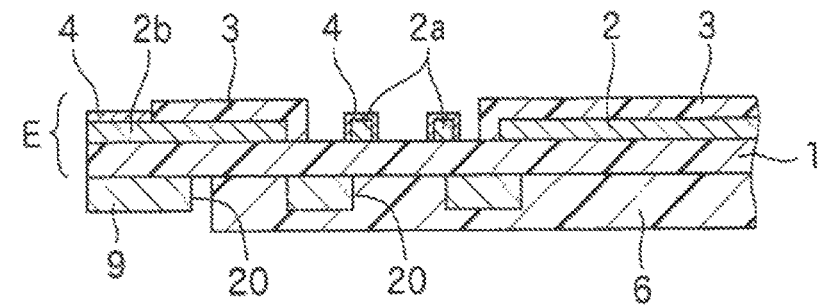

For the formation of the optical waveguide W (with reference to FIG. 1A) on the back surface of the insulation layer 1 (back surface of the metal layer 9 in the portion where the metal layer 9 is formed), a photosensitive resin that is the material for the formation of the under cladding layer 6 is applied to the back surfaces (the lower surfaces as seen in the figure) of the insulation layer 1 and the metal layer 9, as shown in FIG. 4B. Thereafter, the applied layer is exposed to irradiation light. This exposure cures the applied layer to form the under cladding layer 6. The under cladding layer 6 is formed into a predetermined pattern by a photolithographic process. The under cladding layer 6 fills the through hole 5 for the optical path in the metal layer 9 (with reference to FIG. 1A). Also, part of the under cladding layer 6 extends into the openings 20 of the metal layer 9, and is directly joined to the back surface of the insulation layer 1. The under cladding layer 6 has a thickness (thickness as measured from the back surface of the insulation layer 1) generally greater than the thickness of the metal layer 9. A series of operations for the formation of the optical waveguide W are performed while the back surface of the insulation layer 1 on which the metal layer 9 is formed is oriented upward. However, the orientation is shown unchanged in the figure.

Figure 4C:
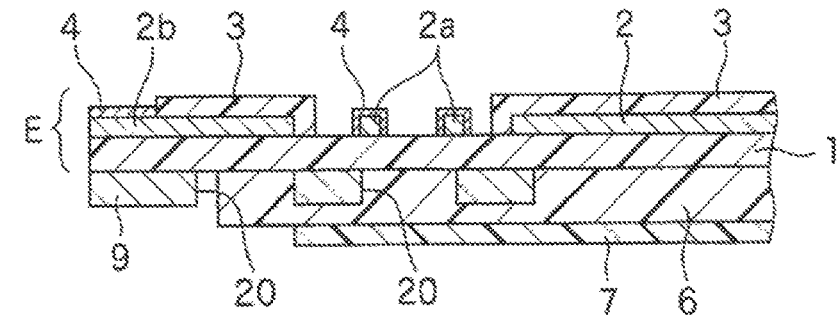

Next, as shown in FIG. 4C, the core 7 having a predetermined pattern is formed on the front surface (the lower surface as seen in the figure) of the under cladding layer 6 by a photolithographic process. The core 7 has a thickness in the range of 3 to 100 μm, for example, and a width in the range of 3 to 100 μm, for example. An example of the material for the formation of the core 7 includes a photosensitive resin similar to that for the under cladding layer 6, and the material used herein has a refractive index higher than that of the material for the formation of the under cladding layer 6 and the over cladding layer 8 to be described below. The adjustment of the refractive indices may be made, for example, by adjusting the selection of the types of the materials for the formation of the under cladding layer 6, the core 7 and the over cladding layer 8, and the composition ratio thereof.

Figure 4D:
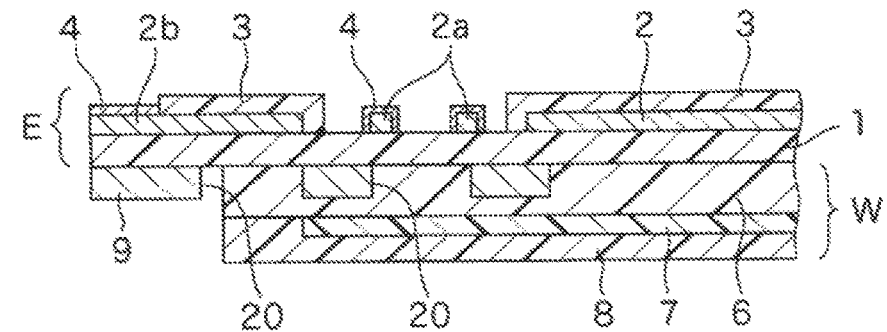

Next, as shown in FIG. 4D, the over cladding layer 8 is formed on the front surface (the lower surface as seen in the figure) of the under cladding layer 6 by a photolithographic process so as to cover the core 7. In this manner, the optical waveguide W is formed. The over cladding layer 8 has a thickness (thickness as measured from the front surface of the under cladding layer 6) not less than that of the core 7 and not greater than 300 μm, for example. An example of the material for the formation of the over cladding layer 8 includes a photosensitive resin similar to that for the under cladding layer 6.

Specific composition examples of the materials for the formation of the optical waveguide W are as follows.

<Materials for Formation of Under Cladding Layer 6 and Over Cladding Layer 8>

20 parts by weight of an epoxy resin containing an alicyclic skeleton (EHPE 3150 available from Daicel Chemical Industries, Ltd.)

80 parts by weight of a liquid long-chain bifunctional semi-aliphatic epoxy resin (EXA-4816 available from DIC Corporation)

2 parts by weight of a photo-acid generator (SP170 available from ADEKA Corporation)

40 parts by weight of ethyl lactate (available from Musashino Chemical Laboratory, Ltd.)

<Material for Formation of Core 7>

50 parts by weight of o-cresol novolac glycidyl ether (YDCN-700-10 available from Nippon Steel & Sumikin Chemical Co., Ltd.)

50 parts by weight of bisphenoxyethanolfluorene diglycidyl ether (OGSOL EG available from Osaka Gas Chemicals Co., Ltd.)

1 part by weight of a photo-acid generator (SP170 available from ADEKA Corporation)

50 parts by weight of ethyl lactate (available from Musashino Chemical Laboratory, Ltd.)

An inclined surface inclined at 45 degrees with respect to the direction in which the core 7 extends is formed in a predetermined port ion of the optical waveguide W by laser beam machining, cutting and the like to provide the reflecting surface 7a (with reference to FIG. 1A) for optical coupling to the optical element to be mounted on the front surface side of the electric circuit board E. Then, necessary members are mounted, for example, by mounting the optical element on the pads 2a of the electrical interconnect lines 2 provided on the front surface side of the electric circuit board E.

In this manner, the opto-electric hybrid board 10 shown in FIGS. 1A to 1C is provided. In the opto-electric hybrid board 10, the four openings 20 are formed by partially removing the region of the metal layer 9 overlaid on each end portion of the optical waveguide W on the back surface side of the electric circuit board E and overlaid on the contour of the optical waveguide W. The under cladding layer 6 of the optical waveguide W extends into the openings 20, and is directly joined to the insulation layer 1.

If a force for peeling off the optical waveguide W is exerted because the metal layer 9 and the optical waveguide W differ from each other in internal stresses gene rated by external loads or heat in the laminate portion comprised of the metal layer 9 and the optical waveguide W, the aforementioned configuration in which the contour of each end portion of the optical waveguide W is partially directly joined to the insulation layer 1 achieves a high peel strength at the junction to thereby achieve a very high peel strength as a whole. Thus, the optical waveguide W does not peel off in its end portions in the manufacturing steps including mounting the optical element and the like, in the step of incorporating the opto-electric hybrid board 10 into an electronic device and the like and during the actual use thereof. This allows the opto-electric hybrid board 10 to be used favorably over a prolonged period.

Further, it is only necessary that, when the metal layer 9 is formed into a pattern, a predetermined portion thereof which is overlaid on the contour of each end portion of the optical waveguide W is patterned so that the openings 20 are formed. Thus, the opto-electric hybrid board 10 is easily attained without any special step. This is advantageous in high manufacturing efficiency.

A test to be described below was conducted for purposes of comparison between the peel strength obtained in the case where the metal layer 9 and the optical waveguide W were joined to each other and the peel strength obtained in the case where the insulation layer 1 and the optical waveguide W we re directly joined to each other.

<Peel Strength Test>

A stainless steel plate (SUS 304 available from Nippon Steel Corporation and having a thickness of 0.02 mm) used widely as a metal layer for an opto-electric hybrid board was prepared. Then, using the materials for the formation of the optical waveguide W, a quasi-optical waveguide having a three-layer structure comprised of an under cladding layer with a thickness of 25 µm, a core with a thickness of 50 µm and an over cladding layer with a thickness of 25 µm was formed on the front surface of the stainless steel plate (Sample 1). Also, a polyimide (available from Nitto Denko Corporation and having a thickness of 0.01 mm) was formed on the aforementioned metal layer as an insulation layer for an opto-electric hybrid board, and the metal layer was etched. Then, a quasi-optical waveguide was formed on the front surface of the metal layer (Sample 2).

Then, 90-degree peel strengths in Samples 1 and 2 during the peeling off of the respective quasi-optical waveguides were measured pursuant to a testing method defined in JIS C 5016:1994. As a result, the peel strength in Sample 1 (stainless steel plate as a base) was 0.209 N/cm (21.3 g/cm), and the peel strength in Sample 2 (polyimide as a base) was 1.986 N/cm (202.6 g/cm).

It is hence found that a very high capability to prevent peeling off is imparted to the optical waveguide W by directly joining part of the optical waveguide W to the insulation layer 1 as illustrated in the aforementioned instance.

When the openings 20 are formed in the metal layer 9 in the aforementioned instance, it is preferable that 5 to 95% of the total length of the contour (indicated by zigzag lines in FIG. 1B) of the end portion of the optical waveguide W in overlaid relation with the metal layer 9 is in direct contact with the back surface of the insulation layer 1 because of the presence of the openings 20. When the percentage of the contour in contact with the back surface of the insulation layer 1 because of the presence of the openings 20 is less than the aforementioned range, there is apprehension that the effect of preventing the optical waveguide W from peeling off is not sufficiently produced. When the percentage is greater than the aforementioned range, there is apprehension that the reinforcement achieved by the metal layer 9 is insufficient depending on the structure of the opto-electric hybrid board 10, which in turn is not preferable.

Figure 5A:
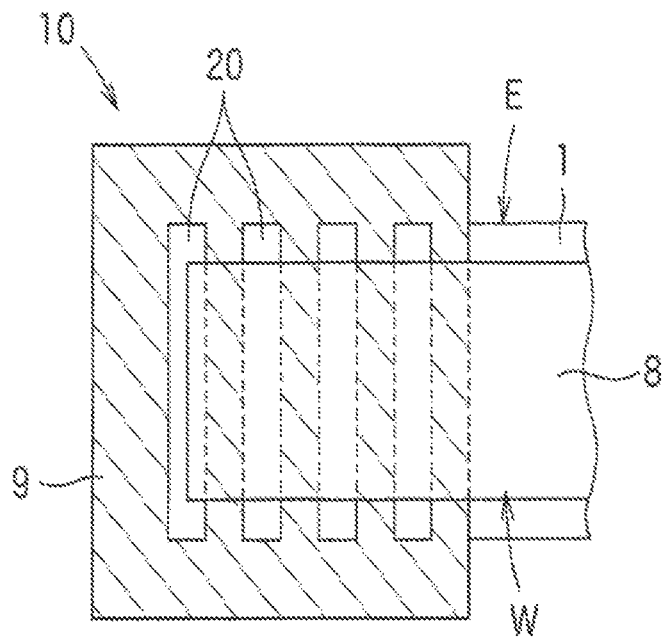
FIGS. 5A and 5B are illustrations of modifications of the shape of openings in a metal layer in the aforementioned example.
Figure 5B:
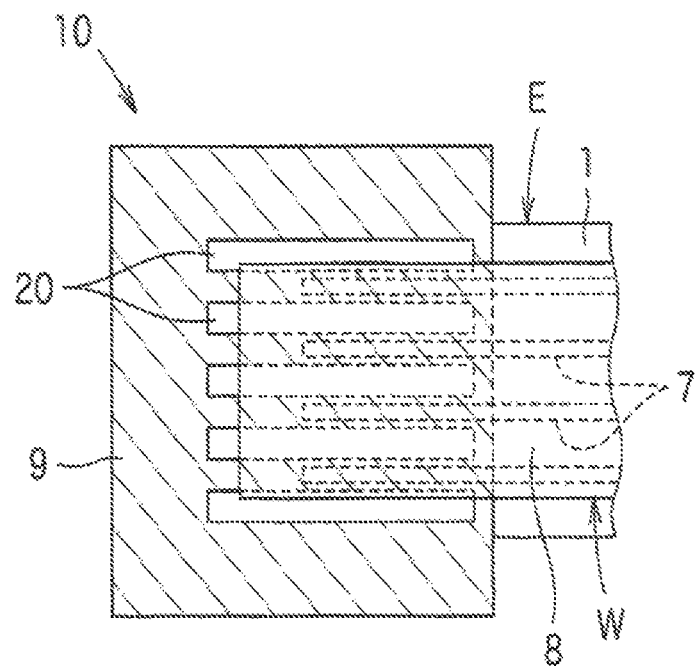

The shape of the openings 20 is not limited to that of the aforementioned instance. For example, as shown in FIGS. 5A and 5B, strip-shaped openings 20 may be arranged in parallel, so that the openings 20 are discontinuously overlaid on the contour of the optical waveguide W.

Figure 6A:
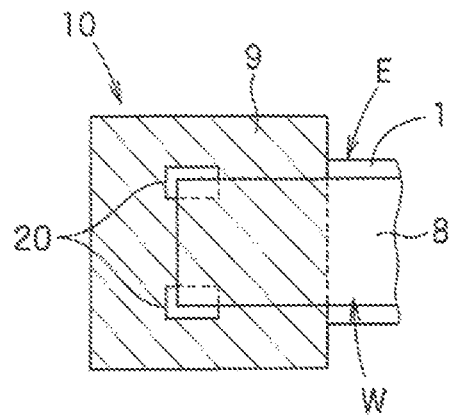
FIGS. 6A to 6F are illustrations of modifications of the shape of the openings in the metal layer in the aforementioned example.
Figure 6B:
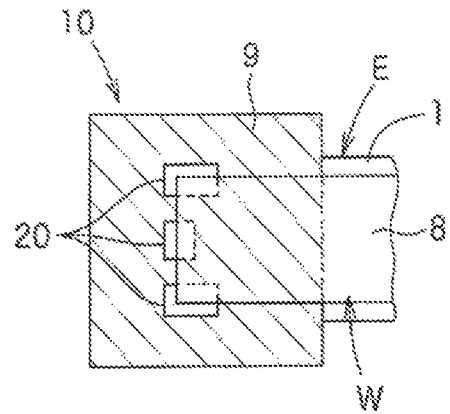

In the instance shown in FIGS. 1A to 1C, the four openings 20 are provided in the metal layer 9 along the contour of the optical waveguide W. However, the openings 20 may be provided only in two locations overlaid on the two corners at the front end of the contour of the optical waveguide W, as shown in FIG. 6A, for example, for the following reason. When the insulation layer 1 and the optical waveguide W are directly joined to each other with a high peel strength in at least these two corner locations, these portions of the optical waveguide W are prevented from peeling off, so that the opto-electric hybrid board 10 is used favorably. Also, as shown in FIG. 6B, the provision of the openings 20 in three locations, i.e. two locations overlaid on the two corners at the front end and one intermediate location overlaid on an end edge of the optical waveguide W, increases the effect of preventing the end edge portion of the optical waveguide W from peeling off.

Figure 6C:
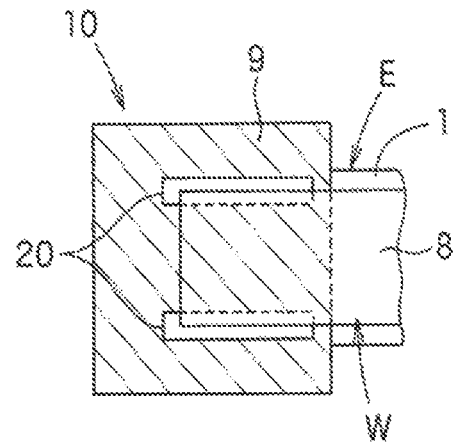
Figure 6D:
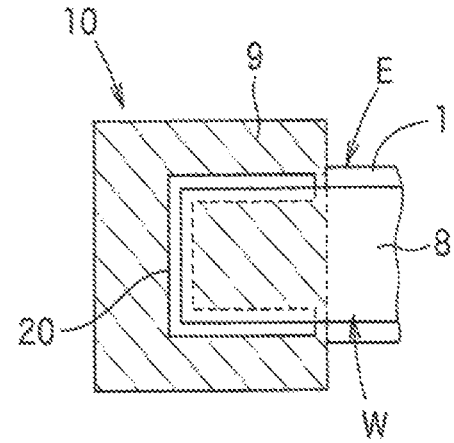

Alternatively, examples of the shape (shape as seen in plan view; the same shall apply hereinafter) of the opening (s) 20 provided in the metal layer 9 may be as follows: the shape of two strips extending along the opposite edges extending along the length of the optical waveguide W as shown in FIG. 6C; and the shape of one strip having two corners and extending along the contour of the end portion of the optical waveguide W as shown in FIG. 6D.

Figure 6E:
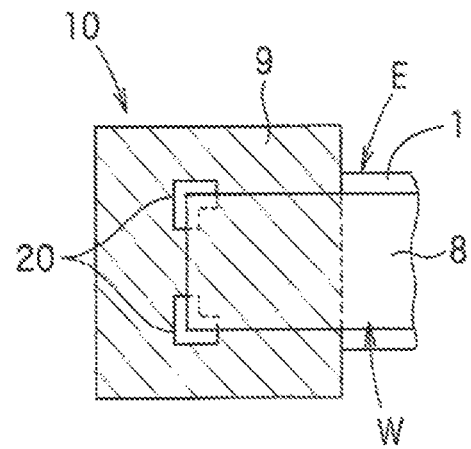
Figure 6F:
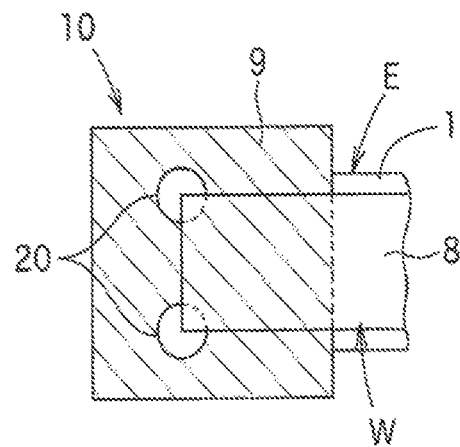

When the openings 20 are formed in locations overlaid on the two corners at the front end of an end portion of the optical waveguide W, examples of the shape of the two openings 20 may be a bent shape along the corners as shown in FIG. 6E, and a round shape as shown in FIG. 6F.

Figure 7A:
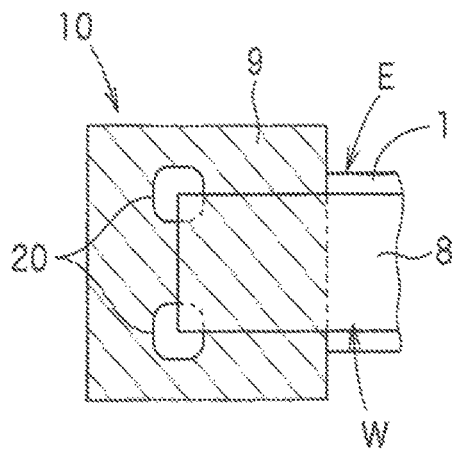
FIGS. 7A to 7D are illustrations of modifications of the shape of the openings in the metal layer in the aforementioned example.
Figure 7B:
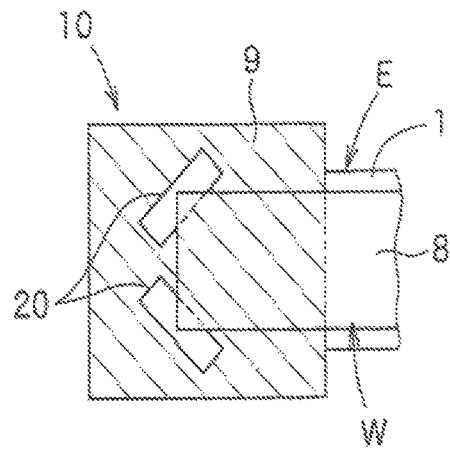
Figure 7C:
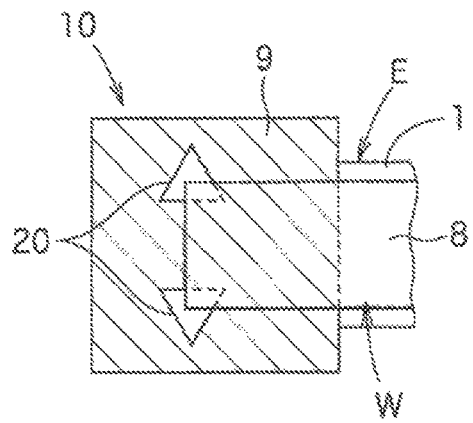
Figure 7D:
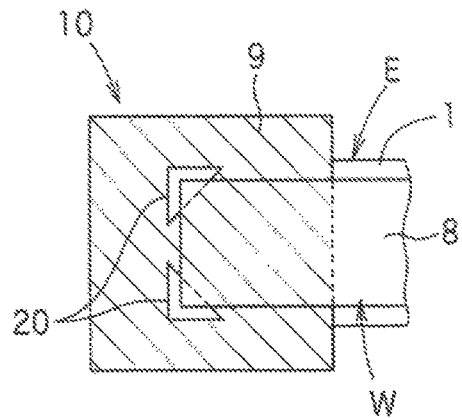

Further, examples of the shape of the aforementioned two openings 20 may be as follows: a rectangular shape with rounded corner portions as shown in FIG. 7A; the shape of strips extending obliquely with respect to the corners of the optical waveguide W as shown in FIG. 7B; and triangular shapes as shown in FIGS. 7C and 7D.

In this manner, the opening (s) 20 may have various shapes so as to produce the effect of preventing an end portion of the optical waveguide W from peeling off while consideration is given to a trade-off between a region to which rigidity is desired to be imparted by the metal layer 9 and a region to which flexibility is desired to be imparted.

Figure 8:
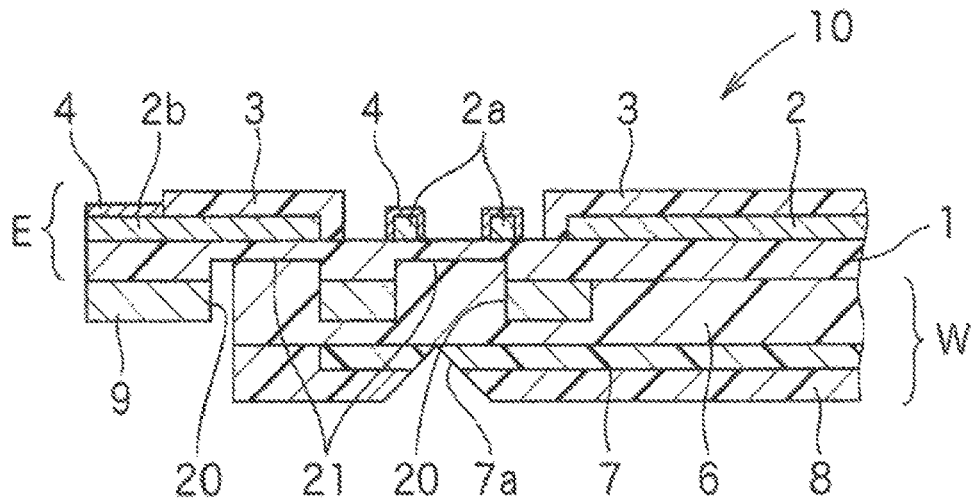
FIG. 8 is schematic partial vertical sectional view of another embodiment of the present invention.

In the aforementioned instance, the openings 20 are provided in the metal layer 9, and part of the optical waveguide W extends into the openings 20. In addition to the openings 20 formed by partially removing the metal layer 9, recesses 21 may be formed by the process of denting the insulation layer 1 uncovered by the openings 20, as shown in FIG. 8, to increase the step height, thereby further increasing the peel strength therebetween. Such a configuration makes the end portion of the optical waveguide W less prone to peel off to achieve greater durability.

Figure 9A:
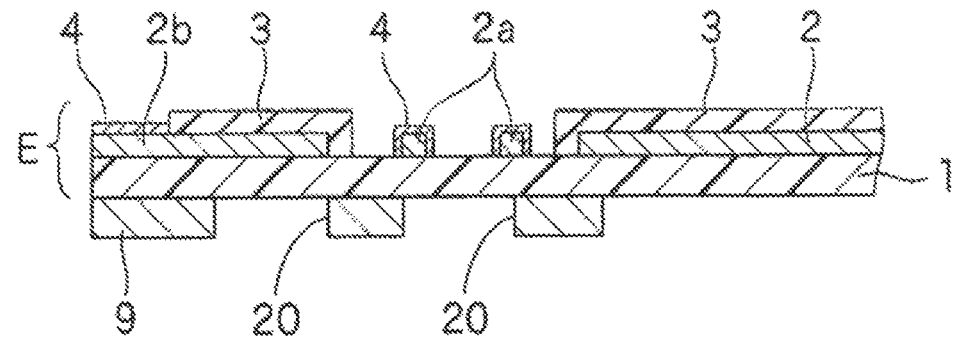
FIGS. 9A to 9C are illustrations showing the steps of producing the optical waveguide in the method of manufacturing the opto-electric hybrid board.
Figure 9B:
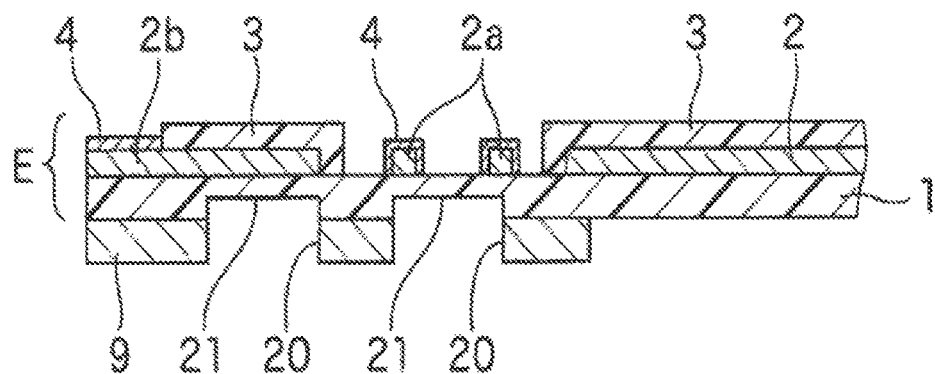
Figure 9C:
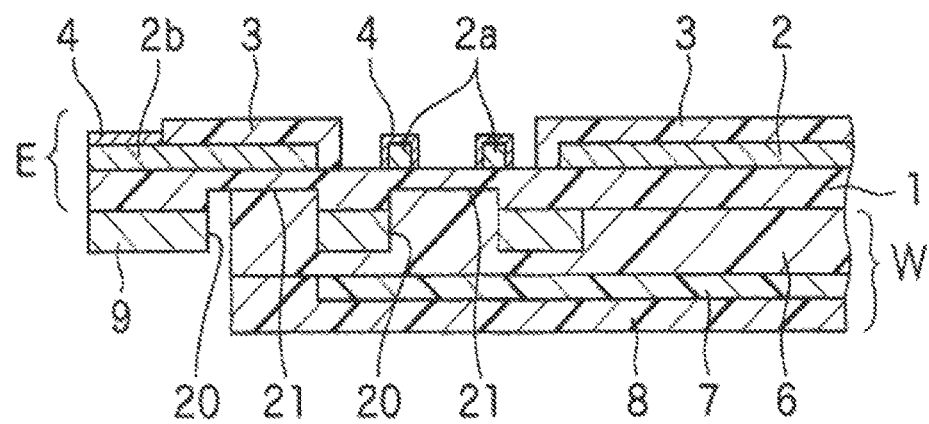

The aforementioned process of denting the insulation layer 1 is performed, for example, in a manner to be described below. First, as shown in FIG. 9A, the electric circuit board E is formed in the same manner as in the aforementioned instance, and the openings 20 and the through hole 5 for optical coupling (with reference to FIGS. 1A to 1C) are formed in the metal layer 9 on the back surface side of the electric circuit board E. Then, as shown in FIG. 9B, alkaline etching is performed on portions of the insulation layer 1 uncovered in the openings 20 of the metal layer 9 while the remaining port ions are protected, so that the recesses 21 are formed. Then, as shown in FIG. 9C, the optical waveguide W is formed in the same manner as in the aforementioned instance. Thereafter, the processes of mounting an optical element and the like and forming the reflecting surface 7a are performed, for example. This provides an intended opto-electric hybrid board.

It is preferable that the recesses 21 have a depth that is 5 to 70% of the thickness of the entire insulation layer 1 (for example, when the thickness of the entire insulation layer 1 is 10 µm, it is preferable to form the recesses 21 so that portions of the insulation layer 1 where the recesses 21 are formed by etching have a thickness in the range of 3 to 9.5 µm). When the recesses 21 are too shallow, no difference is found in the effect of preventing the optical waveguide W from peeling off in spite of the provision of the recesses 21. When the recesses 21 are too deep, there is apprehension about a problem such as a break in the insulation layer 1 in the aforementioned portions, which in turn is not preferable.

The process for denting the insulation layer 1 is not limited to that described above. For example, in the stage of the configuration shown in FIG. 9A, a YAG laser or an excimer laser may be directed onto the portions of the insulation layer 1 uncovered in the openings 20 of the metal layer 9 to melt away a predetermined thickness of a predetermined region of the back surface (lower surface as seen in FIGS. 9A to 9C) of the insulation layer 1, thereby forming the recesses 21.

In the aforementioned instances, the end portions of the optical waveguide W are disposed in overlaid relation with the metal layer 9 having an increased width in the opposite end portions of the opto-electric hybrid board 10, and the contour of each end portion of the optical waveguide W is inside the contour of the metal layer 9. However, the present invention is applicable to the opto-electric hybrid board 10 of a strip-shaped configuration entirely having the same width. The present invention is also applicable to the opto-electric hybrid board 10 in which the contour of each end portion of the optical waveguide W coincides with the contour of the metal layer 9 or is outside the contour of the metal layer 9. In these cases, the openings 20 may be formed by partially removing the metal layer 9 with an appropriate arrangement in an area where each end portion of the optical wave guide W coincides with each end portion of the metal layer 9, whereby the effect of preventing the optical waveguide W from peeling off is also produced.

Figure 10A:
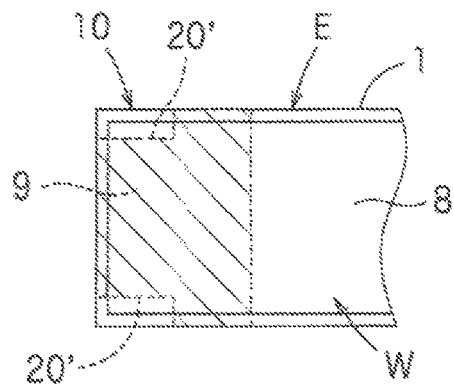
FIGS. 10A to 10F are illustrations of modifications of the shape of the openings in the metal layer according to another embodiment of the present invention.

An example of the arrangement in which the contours of the metal layer 9 and an end portion of the optical waveguide W substantially coincide with each other is shown in FIG. 10A. In this example, the contour of the optical waveguide W is shown as placed slightly inside the contour of the metal layer 9 for the sake of clarity (the same applies to FIG. 10B and its subsequent figures). In this example, openings 20' are provided by cutting away two corner portions at the front end of the metal layer 9 disposed in such a configuration that the contour thereof substantially coincides with the contour of the end portion of the optical waveguide W. In this configuration, two corner portions at the front end of the optical waveguide W are directly joined to the insulation layer 1. This effectively prevents the front end portion of the optical waveguide W from peeling off. Thus, the term "opening" formed in the metal layer 9 as used in the present invention is to be interpreted as including not only a closed opening surrounded on all sides but also a cutaway portion formed by cutting away an edge of the metal layer 9.

Figure 10B:
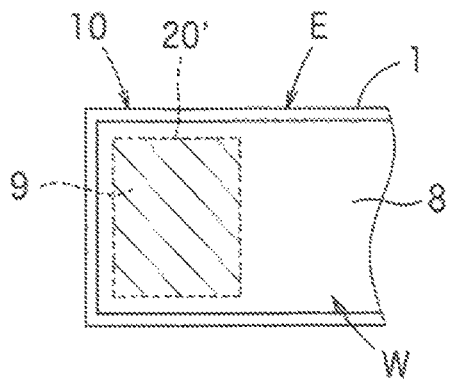
Figure 10C:
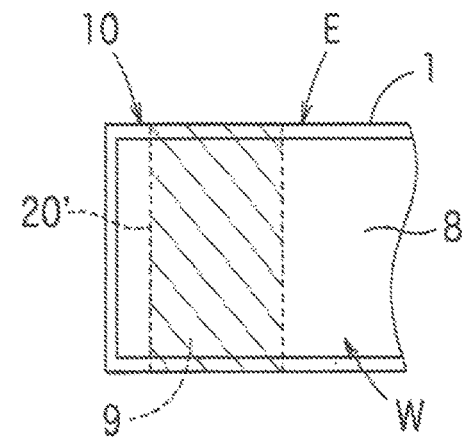

In the case where the metal layer 9 and the end portion of the optical waveguide W are disposed in the same manner as mentioned above, an opening 20' may be provided by completely removing three sides, i.e. a front end edge and opposite side edges extending along the length of the optical waveguide W, of the contour of the metal layer 9, as shown in FIG. 10B. Further, an opening 20' may be provided by removing only the front end edge of the contour of the metal layer 9, as shown in FIG. 10C.

Figure 10D:
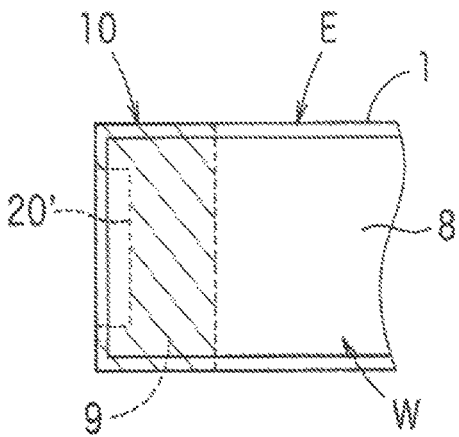

Alternatively, an opening 20' may be provided by removing the front end edge of the contour of the metal layer 9, with the opposite end portions thereof left unremoved, as shown in FIG. 10D, rather than by completely removing the front end edge. This also sufficiently produces the effect of preventing the optical waveguide W from peeling off. That is, the degree of freedom of the optical waveguide W is limited also on its opposite ends where the opening 20' is not formed because the joint strength of the optical waveguide W is increased in the opening 20'. As a result, the optical waveguide W is less prone to peel off even when the metal layer 9 is interposed on the opposite ends.

Figure 10E:
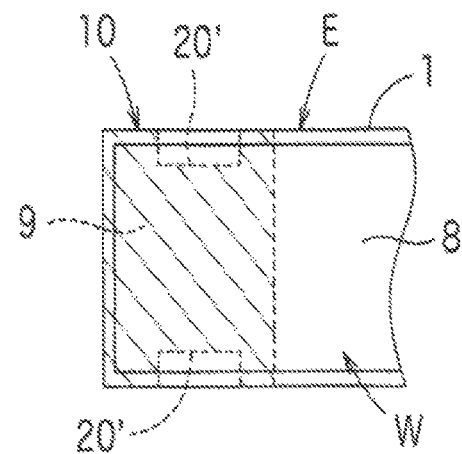
Figure 10F:
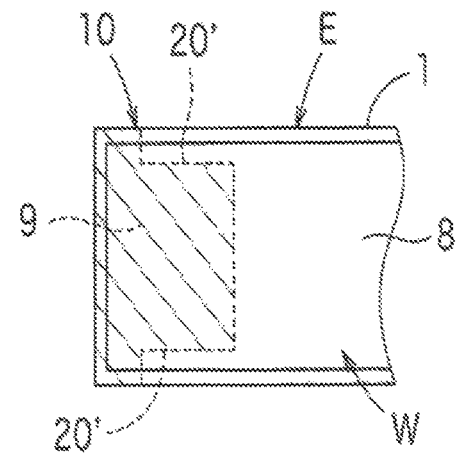

Likewise, openings 20' may be provided by removing the opposite side edges of the contour of the metal layer 9 which extend along the length of the optical waveguide W, with the opposite end portions of the side edges left unremoved, as shown in FIG. 10E. Alternatively, openings 20' may be provided by removing the opposite side edges of the contour of the metal layer 9 which extend along the length of the optical waveguide W, with the front end portions of the side edges left unremoved, as shown in FIG. 10F.

Figure 11A:
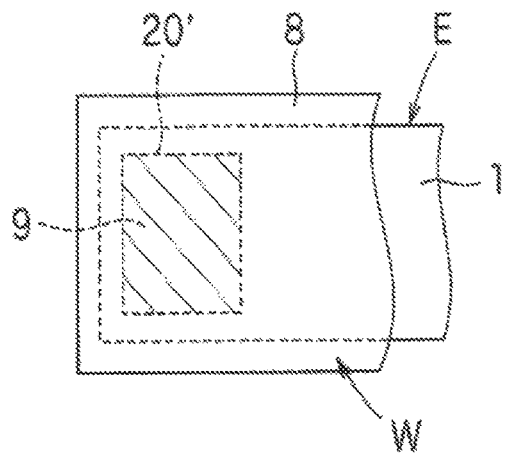
FIGS. 11A to 11E are illustrations of modifications of the shape of the openings in the metal layer according to still another embodiment of the present invention.

Depending on the opto-electric hybrid board 10, there are cases in which the contour of the optical waveguide W is outside the contour of the electric circuit board E. In such cases, at least one opening 20' may be formed by cutting away a predetermined portion of the metal layer 9, so that the end portion of the optical waveguide W is less prone to peel off in the same manner as in the aforementioned examples. For example, when the electric circuit board E and the optical waveguide W are disposed in overlaid relation in such a configuration that the contour of an end portion of the optical waveguide W is outside the contour of the electric circuit board E as shown in FIG. 11A, an opening 20' may be provided by completely removing three sides, i.e. a front end edge and opposite side edges extending along the length of the optical waveguide W, of the contour of the metal layer 9 inside the contour of the end portion of the optical waveguide W. This makes the end portion of the optical waveguide W less prone to peel off. In this example, the front end of the optical waveguide W is disposed outside the front end of the electric circuit board E. However, for example, when the front end of the optical waveguide W substantially coincides with the front end of the electric circuit board E or is disposed inside the front end of the electric circuit board E as shown in FIG. 11B, an opening 20' may be provided by completely removing the three sides of the contour of the metal layer 9 in the same manner as in the example of FIG. 11A.

Figure 11B:
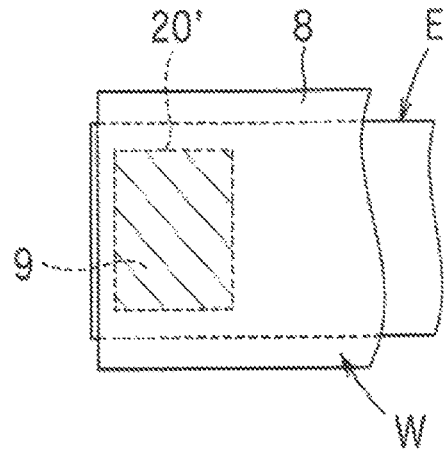
Figure 11C:
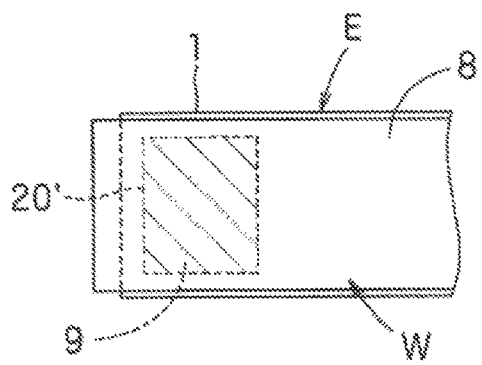

Also, when the front end of the optical waveguide W is disposed outside the front end of the electric circuit board E and the opposite longitudinal side edges of the optical waveguide W substantially coincide with those of the electric circuit board E or are disposed inside those of the electric circuit board E as shown in FIG. 11C, an opening 20' may be provided by completely removing the three sides of the contour of the metal layer 9 in the same manner as in the examples of FIGS. 11A and 11B. This makes the end portion of the optical waveguide W less prone to peel off.

Figure 11D:
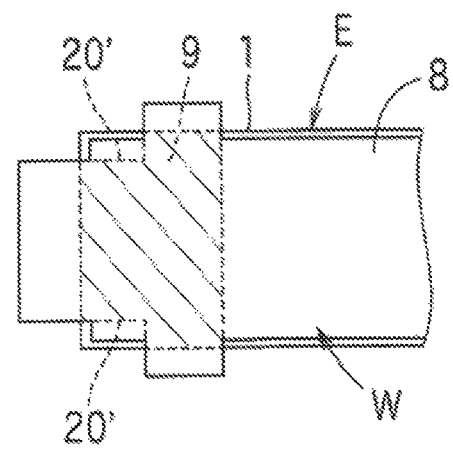

Further, as shown in FIG. 11D, openings 20' may be formed by cutting away two corner portions of the front end of the metal layer 9, and part of the contour of the optical waveguide W may be directly joined to the insulation layer 1 in these openings 20', so that the contour of the optical waveguide W coinciding with the contour of the metal layer 9 is disposed outside the contour of the electric circuit board E.

Figure 11E:
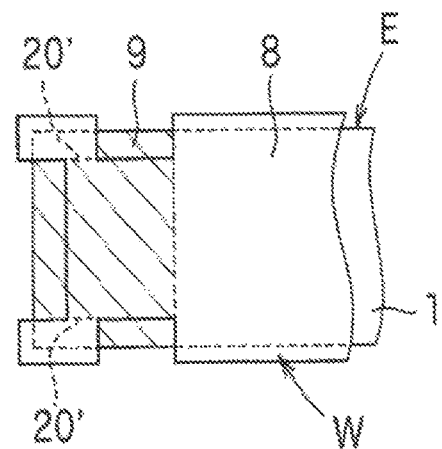

Also, as shown in FIG. 11E, openings 20' may be formed by cutting away two corner portions of the front end of the metal layer 9 in the same manner as described above, and part of the contour of the optical waveguide W may be directly joined to the insulation layer 1 in these openings 20', so that the contour of the optical waveguide W coinciding with the contour of the insulation layer 1 is disposed outside the contour of the electric circuit board E.

In the examples of the aforementioned openings 20', strip-shaped openings 20 may be arranged in parallel, as in the examples shown in FIGS. 5A and 5B. Alternatively, openings 20' each having a small area may be spaced at predetermined intervals along the contour of the metal layer 9.

When the metal layer 9 is overlaid on the end port ion of the optical waveguide W in such a configuration that the contour of the end portion of the optical waveguide W coincides with the contour of the metal layer 9 or is disposed outside the contour of the metal layer 9 as in the aforementioned examples, it is preferable that the metal layer 9 overlaid on the optical waveguide W is shaped to have rounded corners as seen in plan view. The rounded corner shape provides a stress relaxation effect at a boundary between a region where the metal layer 9 is present and a region where the metal layer 9 is absent.

Figure 12A:
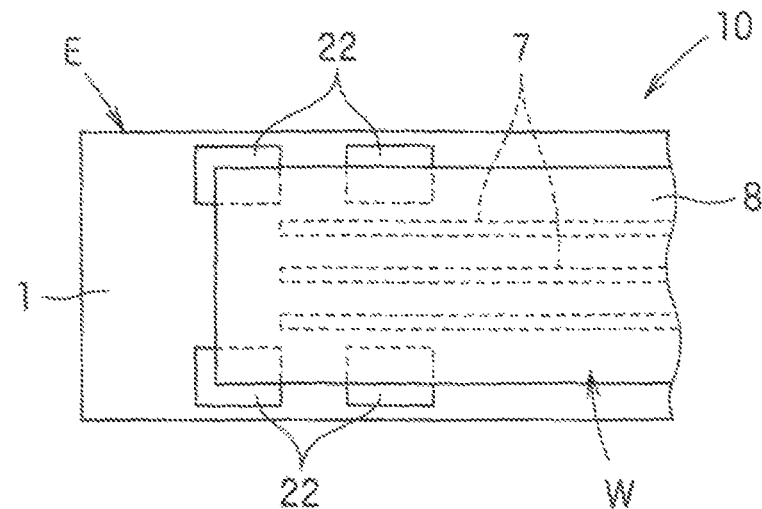
FIG. 12A is an illustration of another embodiment of the present invention.

The present invention is also applicable to the opto-electric hybrid board 10 in which the metal layer is not provided and in which the optical waveguide W is directly overlaid on the back surface of the insulation layer 1, as shown in FIG. 12A. The insulation layer 1 and the optical waveguide W are made of different materials although the two types of resins are joined together in the laminate portion comprised of the insulation layer 1 and the optical waveguide W. Thus, warpage and distortions are prone to occur in the optical waveguide W due to the difference in stresses between the insulation layer 1 and the optical waveguide W, thereby making the optical waveguide W prone to peel off in some cases. To increase the peel strength of the insulation layer 1 and the optical waveguide W, recesses 22 may be formed in the back surface of the insulation layer 1 overlaid on the optical waveguide W, as shown in FIG. 12A, and part of the optical waveguide W may extend into the recesses 22. The arrangement of the recesses 22 may be formed in conformity with the arrangement of the aforementioned openings 20 and 20'.

In this configuration, part of the optical waveguide W extends into the recesses 22 to produce the effect of casting anchor in the insulation layer 1. This further increases the peel strength, as compared with a configuration in which the insulation layer 1 and the optical waveguide W have flat joint surfaces, to further produce the effect of preventing the optical waveguide W from peeling off.

Figure 12B:
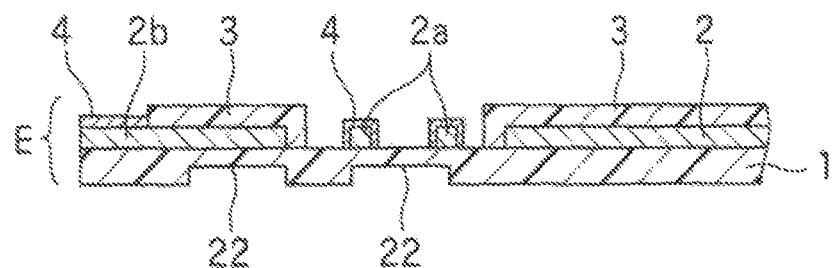
FIGS. 12B and 12C are illustrations showing the steps of producing the same.
Figure 12C:
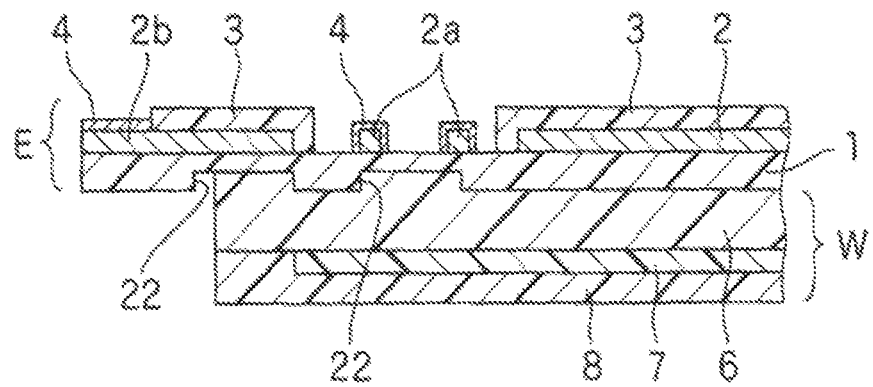
Figure 13:
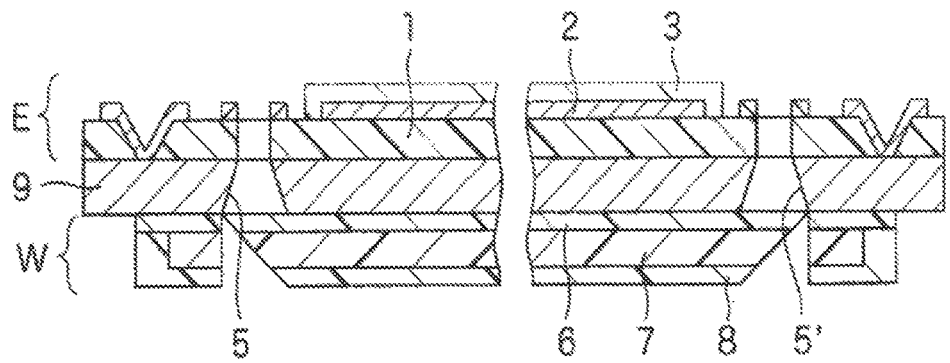
FIG. 13 is a schematic vertical sectional view of an example of a conventional opto-electric hybrid board.

An example of the process of forming the recesses 22 in the insulation layer 1 is as follows. First, the electric circuit board E is formed in the same manner as in the aforementioned instance, as shown in FIG. 12B. Thereafter, alkaline etching is performed on the back surface of the insulation layer 1 while other than portions where the recesses 22 are to be formed are protected, so that the recesses 22 are formed. Then, as shown in FIG. 12C, the optical waveguide W is formed in the same manner as in the aforementioned instance. Thereafter, the processes of mounting an optical element and the like and forming the reflecting surface 7a are performed, for example. This provides an intended opto-electric hybrid board. It is preferable that the recesses 22 have a depth that is 5 to 70% of the thickness of the insulation layer 1 for the same reason as in the formation of the recesses 21.

Of course, the recesses 22 having a predetermined pattern may be formed by directing a YAG laser or an excimer laser onto the back surface of the insulation layer 1, rather than by performing the alkaline etching.

In the aforementioned instance, the opto-electric hybrid board 10 has a bilaterally symmetric structure in which opto-electric coupling portions are provided in both left-hand and right-hand end portions thereof. However, an opto-electric coupling portion may be provided in one end portion, whereas the other end portion is merely for connection to a connector. In such a case, it is preferable that the configuration of the present invention is applied to an end portion of the optical waveguide W which is used for opto-electric coupling.

Also, in the aforementioned instances, the outside shape of the optical waveguide W is defined by both the under cladding layer 6 and the over cladding layer 8. However, the outside shape of the optical waveguide W may be defined by only the over cladding layer 8 or the core 7.

Although specific forms in the present invention have been described in the aforementioned embodiments, the aforementioned embodiments should be considered as merely illustrative and not restrictive. It is contemplated that various modifications evident to those skilled in the art could be made without departing from the scope of the present invention.

The present invention is applicable to an excellent opto-electric hybrid board usable with security over a prolonged period because an optical waveguide is less prone to peel off the back surface side of an electric circuit board portion.

REFERENCE SIGNS LIST

E Electric circuit board
W Optical waveguide
1 Insulation layer
2 Electrical interconnect lines
9 Metal layer
10 Opto-electric hybrid board
20 Openings

The invention claimed is:

1. An opto-electric hybrid board comprising:
an electric circuit board including an insulation layer and an electrical interconnect line formed on a front surface of the insulation layer;
an optical waveguide including a core, the optical waveguide having an upper surface substantially extending in parallel to the core, a lower surface substantially extending in parallel to the core, and side surfaces joining the upper surface and the lower surface of the optical waveguide, the optical waveguide having a contour as viewed in a first direction, the first direction being perpendicular to the upper surface and the lower surface of the optical waveguide, the contour of the optical waveguide corresponding to the side surfaces of the optical waveguide; and
a metal layer having an upper surface substantially extending in parallel to the upper surface of the optical waveguide, a lower surface substantially extending in parallel to the upper surface of the metal layer, and side surfaces joining the upper surface and the lower surface of the metal layer, the metal layer having a contour as viewed in the first direction,
wherein the optical waveguide is provided on a back surface side of the insulation layer of the electric circuit board, with the metal layer therebetween,
wherein the metal layer is overlaid on at least one end portion of the optical waveguide in such a configuration that the contour of the end portion of the optical waveguide is disposed inside the contour of the metal layer, as viewed in the first direction,
wherein at least one opening is formed in the metal layer, the at least one opening being disposed at a position which is overlaid on the contour of the end portion of the optical waveguide, as viewed in the first direction, and
wherein part of the optical waveguide extends into the at least one opening.

2. The opto-electric hybrid board according to claim 1, wherein the at least one opening in the metal layer includes a plurality of openings, and the openings are formed discontinuously along the contour of the end portion of the optical waveguide.

3. An opto-electric hybrid board comprising:
an electric circuit board including an insulation layer and an electrical interconnect line formed on a front surface of the insulation layer; and an optical waveguide including a core, the optical waveguide having an upper surface substantially extending in parallel to the core, a lower surface substantially extending in parallel to the core, and side surfaces joining the upper surface and the lower surface of the optical waveguide, the optical waveguide having a contour as viewed in a first direction, the first direction being perpendicular to the upper surface and the lower surface of the optical waveguide, the contour of the optical waveguide corresponding to the side surfaces of the optical waveguide; and a metal layer having an upper surface substantially extending in parallel to the upper surface of the optical waveguide, a lower surface substantially extending in parallel to the upper surface of the metal layer, and side surfaces joining the upper surface and the lower surface of the metal layer, the metal layer having a contour as viewed in the first direction, wherein the optical waveguide is provided on a back surface side of the insulation layer of the electric circuit board, with the metal layer therebetween, wherein the metal layer is overlaid on at least one end portion of the optical waveguide in such a configuration that the contour of the end portion of the optical waveguide coincides with the contour of the metal layer or is disposed outside the contour of the metal layer, as viewed in the first direction, wherein at least one opening is formed in the metal layer, the at least one opening being disposed at a position in which the contour of the metal layer is overlaid on the end portion of the optical waveguide, as viewed in the first direction, and wherein part of the optical waveguide extends into the at least one opening.

4. The opto-electric hybrid board according to claim 3, wherein the at least one opening in the metal layer includes a plurality of openings, and
wherein the openings are formed discontinuously along the contour of the metal layer.

5. An opto-electric hybrid board comprising:
an electric circuit board including an insulation layer and an electrical interconnect line formed on a front surface of the insulation layer; and
an optical waveguide including a core, the optical waveguide having an upper surface substantially extending in parallel to the core, a lower surface substantially extending in parallel to the core, and side surfaces joining the upper surface and the lower surface of the optical waveguide, the optical waveguide having a contour as viewed in a first direction, the first direction being perpendicular to the upper surface and the lower surface of the optical waveguide, the contour of the optical waveguide corresponding to the side surfaces of the optical waveguide;
wherein the optical waveguide is provided directly on a back surface side of the insulation layer of the electric circuit board,
wherein the insulation layer has an upper surface substantially extending in parallel to the upper surface of the optical waveguide, a lower surface substantially extending in parallel to the upper surface of the insulation layer, and side surfaces joining the upper surface and the lower surface of the insulation layer, the insulation layer having a contour as viewed in the first direction,
wherein the insulation layer is overlaid on at least one end portion of the optical waveguide in such a configuration that the contour of the end portion of the optical waveguide is disposed inside the contour of the insulation layer, as viewed in the first direction,
wherein at least one recess is formed in the insulation layer, the at least one recess being overlaid on the contour of the end portion of the optical waveguide, as viewed in the first direction, and
wherein part of the optical waveguide extends into the at least one recess.

6. The opto-electric hybrid board according to claim 5, wherein the at least one recess in the insulation layer includes a plurality of recesses, and
wherein the recesses are formed discontinuously along the contour of the end portion of the optical waveguide.

7. An opto-electric hybrid board comprising:
an electric circuit board including an insulation layer and an electrical interconnect line formed on a front surface of the insulation layer; and
an optical waveguide including a core, the optical waveguide having an upper surface substantially extending in parallel to the core, a lower surface substantially extending in parallel to the core, and side surfaces joining the upper surface and the lower surface of the optical waveguide, the optical waveguide having a contour as viewed in a first direction, the first direction being perpendicular to the upper surface and the lower surface of the optical waveguide, the contour of the optical waveguide corresponding to the side surfaces of the optical waveguide,
wherein the optical waveguide is provided directly on a back surface side of the insulation layer of the electric circuit board,
wherein the insulation layer has an upper surface substantially extending in parallel to the upper surface of the optical waveguide, a lower surface substantially extending in parallel to the upper surface of the insulation layer, and side surfaces joining the upper surface and the lower surface of the insulation layer, the insulation layer having a contour as viewed in the first direction,
wherein the insulation layer is overlaid on at least one end portion of the optical waveguide in such a configuration that the contour of the end portion of the optical waveguide coincides with the contour of the insulation layer or is disposed outside the contour of the insulation layer, as viewed in the first direction,
wherein at least one recess is formed in the insulation layer, the at least one recess being disposed at a position in which the contour of the insulation layer is overlaid on the end portion of the optical waveguide, as viewed in the first direction, and
wherein part of the optical waveguide extends into the at least one recess.

8. The opto-electric hybrid board according to claim 7, wherein the at least one recess in the insulation layer includes a plurality of recesses, and
wherein the recesses are formed discontinuously along the contour of the insulation layer.

9. A method of manufacturing an opto-electric hybrid board comprising:
preparing an electric circuit board including an insulation layer and an electrical interconnect line formed on a front surface of the insulation layer, a metal layer being formed on a back surface of the insulation layer; and
forming an optical waveguide on the metal layer,
wherein the optical waveguide includes a core, the optical waveguide having an upper surface substantially extending in parallel to the core, a lower surface substantially extending in parallel to the core, and side surfaces joining the upper surface and the lower surface of the optical waveguide, the optical waveguide having a contour as viewed in a first direction, the first direction being perpendicular to the upper surface and the lower surface of the optical waveguide, the contour of the optical waveguide corresponding to the side surfaces of the optical waveguide; and wherein the metal layer has an upper surface substantially extending in parallel to the upper surface of the optical waveguide, a lower surface substantially extending in parallel to the upper surface of the metal layer, and side surfaces joining the upper surface of the metal layer and the lower surface of the metal layer, the metal layer having a contour as viewed in the first direction, wherein the optical waveguide is formed on the metal layer such that the contour of at least one end portion of the optical waveguide is disposed inside the contour of the metal layer, wherein the preparing the electric circuit board includes forming at least one opening by removing at least part of the metal layer which is to be overlaid on the contour of the end portion of the optical waveguide, as viewed in the first direction, and wherein the forming the optical waveguide includes forming the optical waveguide such that part of the optical waveguide extends into the at least one opening in the metal layer.

10. The method of manufacturing an opto-electric hybrid board according to claim 9, wherein the at least one opening in the metal layer includes a plurality of openings, and
wherein the preparing the electric circuit board includes forming the openings discontinuously along the contour of the end portion of the optical waveguide.

11. A method of manufacturing an opto-electric hybrid board comprising:
preparing an electric circuit board including an insulation layer and an electrical interconnect line formed on a front surface of the insulation layer, a metal layer being formed on the back surface of the insulation layer; and
forming an optical waveguide on the metal layer,
wherein the optical waveguide includes a core, the optical waveguide having an upper surface substantially extending in parallel to the core, a lower surface substantially extending in parallel to the core, and side surfaces joining the upper surface and the lower surface of the optical waveguide, the optical waveguide having a contour as viewed in a first direction, the first direction being perpendicular to the upper surface and the lower surface of the optical waveguide, the contour of the optical waveguide corresponding to the side surfaces of the optical waveguide; and
wherein the metal layer has an upper surface substantially extending in parallel to the upper surface of the optical waveguide, a lower surface substantially extending in parallel to the upper surface of the metal layer, and side surfaces joining the upper surface of the metal layer and the lower surface of the metal layer, the metal layer having a contour as viewed in the first direction,
wherein the optical waveguide is formed on the metal layer such that the contour of at least one end portion of the optical waveguide coincides with the contour of the metal layer or is disposed outside the contour of the metal layer,
wherein the preparing the electric circuit board includes forming at least one opening by removing at least part of the metal layer in which the contour of the metal layer is to be overlaid on the end portion of the optical waveguide, as viewed in the first direction, and
wherein the forming the optical waveguide includes forming the optical waveguide such that part of the optical waveguide extending into the at least one opening in the metal layer.

12. The method of manufacturing an opto-electric hybrid board according to claim 11, wherein the at least one opening in the metal layer includes a plurality of openings, and
wherein the preparing the electric circuit board includes forming the openings discontinuously along the contour of the metal layer.

13. A method of manufacturing an opto-electric hybrid board comprising:
preparing an electric circuit board including an insulation layer and an electrical interconnect line formed on a front surface of the insulation layer; and
forming an optical waveguide on the insulation layer,
wherein the optical waveguide includes a core, the optical waveguide having an upper surface substantially extending in parallel to the core, a lower surface substantially extending in parallel to the core, and side surfaces joining the upper surface and the lower surface of the optical waveguide, the optical waveguide having a contour as viewed in a first direction, the first direction being perpendicular to the upper surface and the lower surface of the optical waveguide, the contour of the optical waveguide corresponding to the side surfaces of the optical waveguide,
wherein the insulation layer has an upper surface substantially extending in parallel to the upper surface of the optical waveguide, a lower surface substantially extending in parallel to the upper surface of the insulation layer, and side surfaces joining the upper surface and the lower surface of the insulation layer, the insulation layer having a contour as viewed in the first direction,
wherein the optical waveguide is formed on the insulation layer such that the contour of at least one end portion of the optical waveguide is disposed inside the contour of the insulation layer, as viewed in the first direction,
wherein the preparing the electric circuit board includes forming at least one recess in the insulation layer at a position which is to be overlaid on the contour of the end portion of the optical waveguide, as viewed in the first direction, and
wherein the forming the optical waveguide includes forming the optical waveguide such that part of the optical waveguide extends into the at least one recess in the insulation layer.

14. The method of manufacturing an opto-electric hybrid board according to claim 13,
wherein the at least one recess in the insulation layer includes a plurality of recesses, and
wherein the preparing the electric circuit board includes forming the recesses discontinuously along the contour of the end portion of the optical waveguide.

15. A method of manufacturing an opto-electric hybrid board comprising:
preparing an electric circuit board including an insulation layer and an electrical interconnect line formed on a front surface of the insulation layer; and
forming an optical waveguide on the insulation layer,
wherein the optical waveguide includes a core, the optical waveguide having an upper surface substantially extending in parallel to the core, a lower surface substantially extending in parallel to the core, and side surfaces joining the upper surface and the lower surface of the optical waveguide, the optical waveguide having a contour as viewed in a first direction, the first direction being perpendicular to the upper surface and the lower surface of the optical waveguide, the contour of the optical waveguide corresponding to the side surfaces of the optical waveguide, wherein the insulation layer has an upper surface substantially extending in parallel to the upper surface of the optical waveguide, a lower surface substantially extending in parallel to the upper surface of the insulation layer, and side surfaces joining the upper surface and the lower surface of the insulation layer, the insulation layer having a contour as viewed in the first direction, wherein the optical waveguide is formed on the insulation layer such that the contour of at least one end portion of the optical waveguide coincides with the contour of the insulation layer or is disposed outside the contour of the insulation layer, as viewed in the first direction, wherein the preparing the electric circuit board includes forming at least one recess in the insulation layer at a position in which the contour of the insulation layer itself is to be overlaid on the end portion of the optical waveguide, as viewed in the first direction, and wherein the forming the optical waveguide includes forming the optical waveguide such that part of the optical waveguide extends into the recess in the insulation layer.

16. The method of manufacturing an opto-electric hybrid board according to claim 15, wherein the at least one recess in the insulation layer includes a plurality of recesses, and wherein the preparing the electric circuit board includes forming the recesses discontinuously along the contour of the insulation layer.

* * * * *